United States Patent [19]

Ohta et al.

[11] Patent Number: 4,686,678
[45] Date of Patent: Aug. 11, 1987

[54] SEMICONDUCTOR LASER APPARATUS WITH ISOLATOR

[75] Inventors: Yoshinori Ohta; Isamu Sakuma; Taketoshi Hibiya; Mitsuhito Sakaguchi, all of Tokyo, Japan

[73] Assignee: NEC Corporation, Tokyo, Japan

[21] Appl. No.: 715,954

[22] Filed: Mar. 25, 1985

[30] Foreign Application Priority Data

| Mar. 27, 1984 | [JP] | Japan | 59-43469[U] |
| Mar. 27, 1984 | [JP] | Japan | 59-43470[U] |
| Sep. 7, 1984 | [JP] | Japan | 59-135758[U] |
| Oct. 5, 1984 | [JP] | Japan | 59-151068[U] |

[51] Int. Cl.$^4$ ............................................. H01S 3/00
[52] U.S. Cl. ..................................... 372/33; 350/375; 357/74; 372/36; 372/37; 372/703
[58] Field of Search ............... 372/33, 37, 703, 49, 372/106, 108; 350/375, 377; 357/74

[56] References Cited

U.S. PATENT DOCUMENTS

| 3,840,889 | 10/1974 | O'Brien et al. | 372/36 |
| 4,375,910 | 3/1983 | Seki | 350/375 |
| 4,540,284 | 9/1985 | Gauert et al. | 350/377 |

OTHER PUBLICATIONS

A. W. Smith et al., "Injection Laser with Polarized Output", *IBM Technical Disclosure Bulletin*, vol. 15, No. 4, Sep. 1972, pp. 1152–1153.
Article from Nikkei Electronics (in Japanese), Oct. 10, 1983, pp. 173–194.
Matsui et al., "Suppression of Feedback-Induced Noise in Short-Cavity V-Channeled Substrate Inner Stripe Lasers with Self-Oscillation" (8/1/83), pp. 219–221.
Seki et al., "Optical Isolators for Fiber-Optic Communications", Laser Equipment Development Division, Nippon Electric Co., Ltd., pp. 25–30.

*Primary Examiner*—James W. Davie
*Attorney, Agent, or Firm*—Schwartz, Jeffery, Schwaab, Mack, Blumenthal & Evans

[57] ABSTRACT

The apparatus includes a semiconductor laser diode, a mounting for the laser diode and a casing with a window through which light from the diode passes. The casing hermetically seals the diode. A magneto-optical member is provided between the end face of the laser diode and the window. The magneto-optical member has a spontaneous magnetization oriented in the direction of the light transmission and a magnetic field is applied to saturate the magneto-optical member.

9 Claims, 8 Drawing Figures

FIG. 4
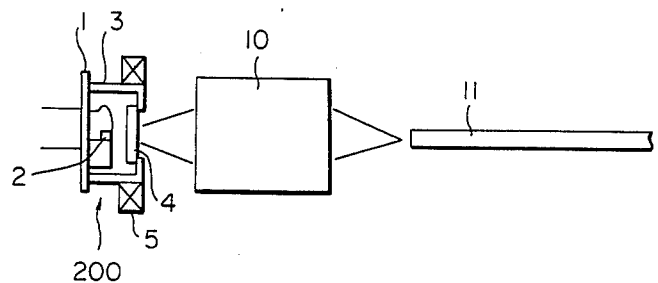
FIG. 5
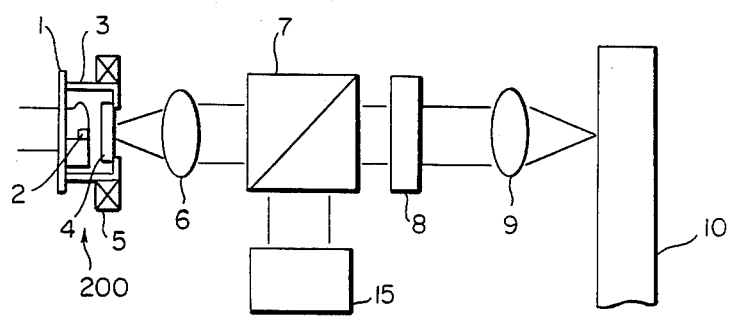
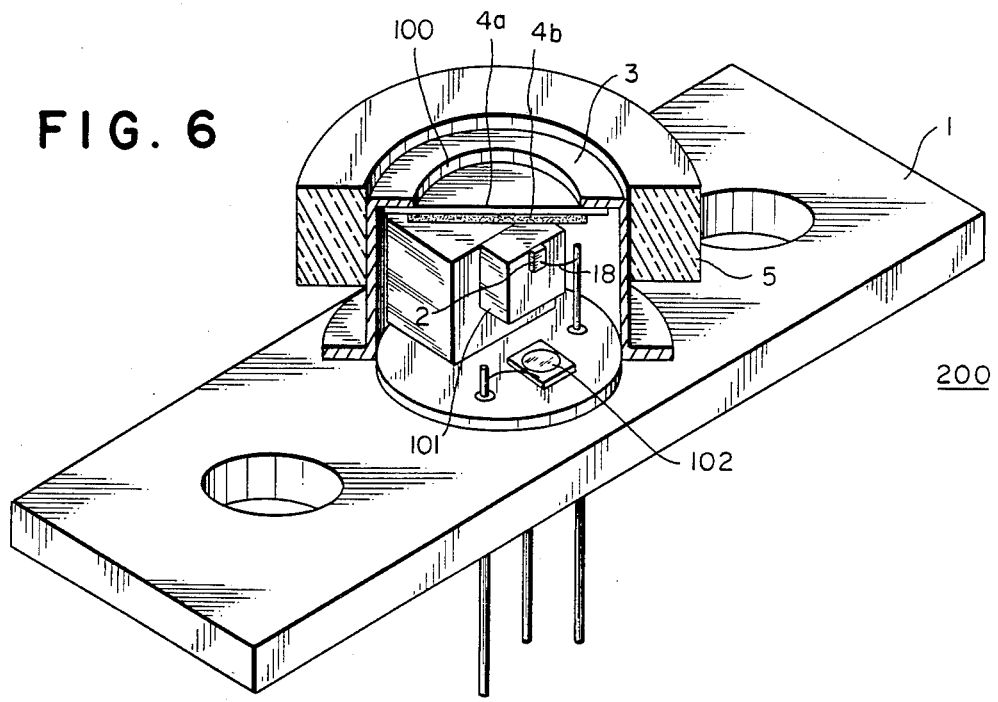
FIG. 6

SEMICONDUCTOR LASER APPARATUS WITH ISOLATOR

BACKGROUND OF THE INVENTION

The present invention relates to a semiconductor laser apparatus widely employed in optical devices such as optical communications apparatus, optical data processing apparatus, or optical instruments, and, more particularly to a semiconductor laser apparatus of a structure which does not induce noise even if reflected light re-enters the same semi-conductor laser.

The semiconductor laser has recently been used in an increasing number of applications, typical examples of which are pickups for optical discs and an optical data transmission terminals.

In a terminal for optical data transmission, for example, the driving current of a semiconductor laser is modulated by data signals to be transmitted, the output light from the laser is focussed by a lens and is coupled to an optical fiber which is a transmission line for the optical signals. In a pickup for an optical disc such as an optical video disc, semiconductor laser beam is directed onto the surface of the optical disc through a plurality of lenses in a finely focused spot to follow the signal track. The light reflected from the recording pit of the optical disc surface is deflected in the direction of the optical path by a half mirror or a polarizing prism inserted between collimating and focusing lenses or between a laser diode and a collimating lens, and then detected by light detectors.

With these optical devices, optical noise problems have occurred in that the light reflected from optical components in the transmission path returns to the semiconductor laser to cause instability of oscillation modes, thereby generating noise. In an optical data transmission terminal, for instance, the light emitted from a semiconductor laser is reflected from both sides of a LD-fiber coupling lens, or the optical fiber ends and returns to the semiconductor laser again. In a pickup of an optical video disc, the light reflected from a disc substrate as well as from optical members provided in the optical path returns and enters the semiconductor laser and causes noise as described above. Noise deteriorates the quality of optical data transmission, and of images reproduced by the disc.

When the S/N of the image reproduced by a video disc is assumed to be 45 dB, the permissible noise level required for a semiconductor laser ranges from $-135$ dB/Hz to $-140$ dB/Hz. When there is no return light, the noise level is maintained in the range from $-140$ to $-150$ dB/Hz with a strong single axial mode, but if there is return light in 0.1%–1%, the level deteriorates to $-110$ to $-120$ dB/Hz accompanied with a decline in the pictorial noise. image S/N to 42 dB, thus remarkably deteriorating the pictorial image quality.

A simple optical isolator comprising the combination of a polarization beam splitter and a quarter-wave length plate is often used in a pickup of conventional optical video discs in order to restrict the return of the reflected light. The principle of the above isolator lies in that the light which has gone through and come out from the quarter-wave length plate perpendicularly intersects the polarized light before it enters said plate and the return light is deflected and eliminated by the polarization beam splitter. However, isolation obtained by such an isolator is limited to the range of 20–25 dB at most even when the reflection at the optical disc plane is not accompanied by a change in polarizing conditions. 0.3–1% of light is always returned to the semiconductor even though the transmittance of a collimating lens which collimates the beam from the semiconductor laser is maintained at 30%. As is well known, the surface of an optical disc is protected with a resin film. As such protective films are not always uniform in refractive index birefringence, the polarized plane of the reflected light becomes rotated.

A polarization beam splitter can therefore not completely eliminate the return light, and the light returning to the semiconductor laser increases to thereby enhance noise.

In order to reduce noise generation due to the axial mode instability of the semiconductor laser, there has been proposed a method of superimposing a high-frequency current of 500 MHz–1 GHz on a DC driving current of the semiconductor laser to reduce the coherence of the laser light even if there is ca. 0.1–1% return light. (See, for example, Nikkei Electronics, 1983, 10, 10, pp. 173–194 (in Japanese)). This method, however, is detrimental as it requires an additional circuit for superposing high frequency current as well as a sophisticated technique for packaging the circuit with the semiconductor laser because the high-frequency circuit should be matched with the semiconductor laser in impedance, the cost becomes inevitably high.

There is known another method for reducing noise which uses a semiconductor laser having oscillation characteristics to cause oscillation of 1 GHz on the emitted light simply by applying a DC current instead of superimposing the high-frequency signals on the driving current. (S. Matsui et al, "Suppression of feedback-induced noise in short cavity V-channeled substrate inner stripe lasers with self-oscillation", Appl. Phys. Lett. 43 (3), Aug. 1 1983, pp. 219–221). The mechanism of such self-oscillation has not been elucidated yet. Effective oscillation characteristics cannot be obtained unless the composition and thickness of the active layer of a semiconductor laser as well as those of the cladding layer adjacent to and between said layer and the substrate are controlled to remain within a closely restricted range. The currently available technique of growing crystal in the semiconductor laser manufacturing process does not have sufficient control over these factors nor reasonable yield, resulting in a high price.

The return of light to a semiconductor may be prevented by inserting in the optical path an optical isolator as an element which has a non-reversible transmission characteristic. Light wavelength of a semiconductor laser employed in an optical video disc, etc. is in the range of 0.78–0.85 micron. Isolators to be employed in the above wavelength range pass the light beam through high density lead glass inserted in an intensive magnetic field (See, for example, M. Saki et al, "Optical Isolators for Fiber-Optic Communications", Paper of Technical Group, TG OQE 78-133, pp. 25–30, IECE of Japan (in Japanese).). However, such an isolator is as large as a match box has considerable weight and costs a great deal. Moreover, such an isolator requires a powerful permanent-magnet to provide a high magnetic field, which inevitably causes considerable magnetic leakage. An isolator of this type cannot therefore be suitably used in a pickup for an optical disc or in optical communication devices.

As described in the above, the prior art methods have drawbacks in one way or another.

SUMMARY OF THE INVENTION

The present invention aims to eliminate the aforedescribed conventional disadvantages and to provide an inexpensive semiconductor laser apparatus with an excellent S/N characteristic.

In order to achieve the above object, the semiconductor laser apparatus according to this invention includes; a semiconductor laser diode; a stem for mounting said semiconductor laser diode; a cap provided with a window through which emitted light from said semiconductor laser diode passes, for hermetically sealing said semiconductor laser diode; a magneto-optical member, provided between an end face of said semiconductor laser diode and said window, for orienting the spontaneous magnetization in the direction of said emitted light transmission; and means for applying a magnetic field in the direction of said emitted light propagation in a manner to saturate the spontaneous magnetization of said magneto-optical member.

As is well known, a ferro magnetic magneto-optical material having spontaneous magnetization saturated by an outer magnetic field acts as a non-reversible element when a magnetic field is applied so as to orient the spontaneous magnetization in the direction of the light transmission. Since the element is located in a position immediately subsequent to the light emitting spot of a semiconductor laser, the reflected light from the incident and emanating planes of an optical member such as a lens, through which the laser light transmits in the process, is provided with a non-reversible characteristic. Therefore, noise caused by the return of light is not induced, and thus an extremely low noise characteristic can be obtained.

BRIEF DESCRIPTION OF THE DRAWINGS

FIG. 4 is a block diagram showing the laser package of the first embodiment used in an optical communication device.

FIG. 5 is a block diagram showing the laser package of the first embodiment for a video disc provided with an isolator which comprises a quarter-wave length plate and a polarization prism.

FIGS. 6 and 7 are perspective views of the second and third embodiment of the present invention respectively.

DETAILED DESCRIPTION OF THE PREFERRED EMBODIMENTS

Figure 1:
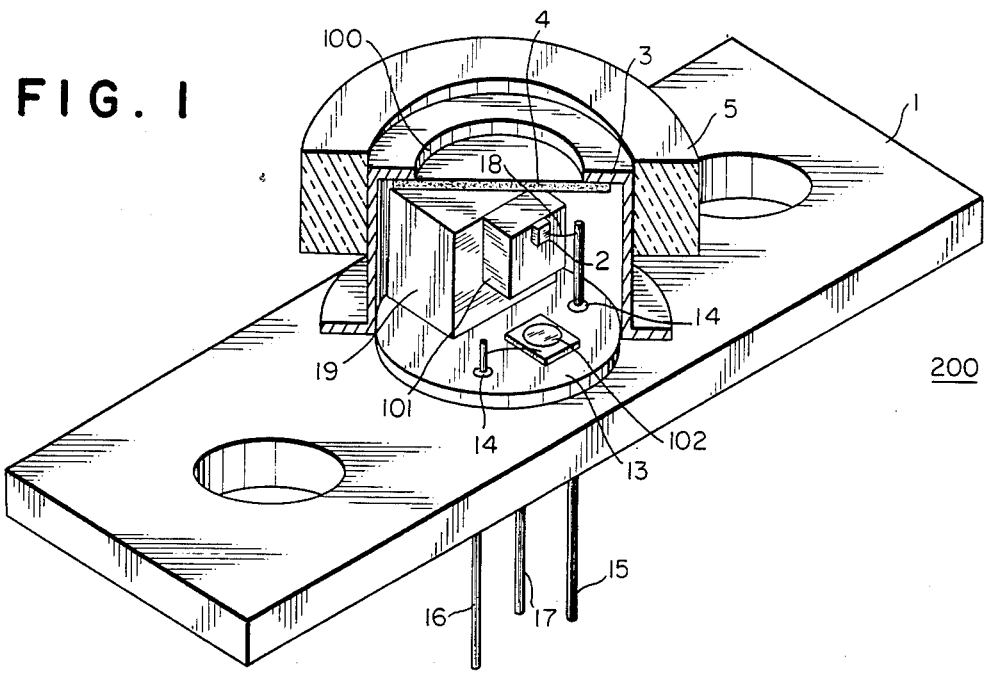
FIG. 1 is a perspective and partially exploded view of the first embodiment of the laser package according to this invention.

FIG. 1 is a perspective view which is partially exploded in cross section of a semiconductor laser apparatus with an isolator packaged according to the first embodiment of the present invention.

The reference numeral 1 refers to a stem for mounting, 2 a semiconductor laser diode (LD), 3 a cap to seal LD, 4 a ferro-magnetic magneto-optical crystal member and 5 a ring magnet generating a sufficient magnetic field to saturate spontaneous magnetization of the magneto-optical crystal member. The magneto-optical crystal member is attached to a window 100 of the cap and has a thickness sufficient to rotate polarized light by 45° in saturated magnetization against the laser light vertically entering the crystal member from the cap. This magneto-optical crystal member is a non-reversible element which produces a rotation by 90° of the light which first passes out through the member and then passes back therethrough because of reflection. The stem 1 includes a base 13 attached to a flange, lead rods 15, 16 fixed on the base via an insulating member 14, and a lead rod 17 directly fixed on the base and a cooling member 19. Except for the member 14, all other materials of the stem are of copper. The laser diode is fused to the cooling member through silicon heat sink 101. Soft soldering, and gold-and-tin alloying methods are usually employed. The lead wire 15 is connected to the laser diode 2 by a thin gold wire 18 which is attached by a wire bonding method. The p-n junction plane of the LD 2 is positioned parallel to the heat sink plane and the direction of the laser beam is perpendicular to the plane of the magneto-optical member. A light detector 102, which monitors the light emanating from the end face of the LD opposite to the magneto-optical member is provided on the base member 13 and one electrode thereof is connected to the lead rod 16 and the other is grounded. The magneto-optical member 3 is attached in advance to window 100 of cap 3 by the soft soldering, the low melting point glass soldering, etc. The cap is fused to the stem 1 by metal fusing, and then a hollow cylindrical magnet 5 is placed over the outside of cap 3.

Figure 2:
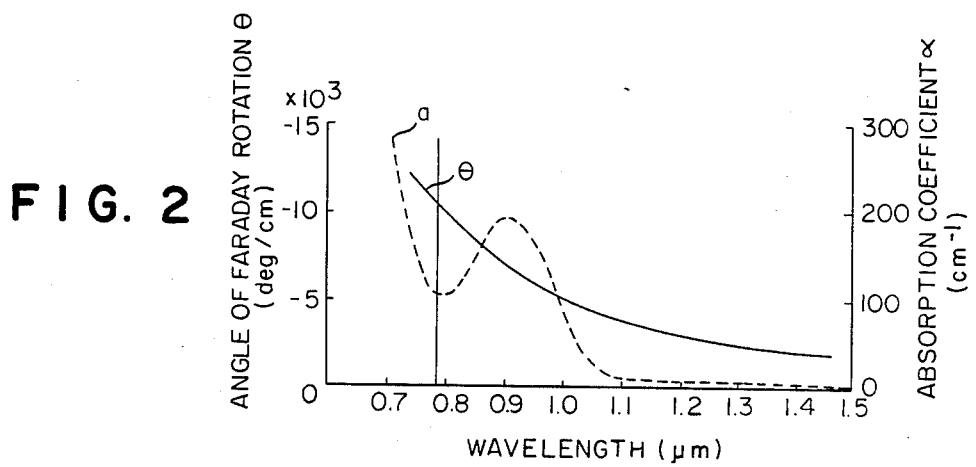
FIG. 2 is a graph indicating the wavelength dependency of Faraday rotation and the light absorption coefficient of a magneto-optical crystal employed in the first embodiment of the present invention.

FIG. 2 shows the magneto-optical characteristics of the magneto-optical crystal plate or a garnet crystal with the composition of $Gd_{3-x} Bi_x Fe_5O_{12}$, which is used in the embodiment shown in FIG. 1. This crystal has a Faraday rotation power of 10,000 deg/cm and light absorption coefficient of 100 cm$^{-1}$, i.e. 434 dB/cm, around the wavelength of 0.78 or 0.83 micron of the emitted light from the semiconductor laser employed in an optical disc. The thickness of the crystal which rotates the transmission light by 45° is 45 microns at the wavelength of 0.78 micron. Light absorption at this point is 2 dB. A Faraday rotation angle of 45° can be obtained for a wavelength of 1.3 microns, which is used generally as the light source of an optical communication system, if the thickness of the crystal is set at ca. 150 microns. The increase in optical loss in this case is approximately 1 dB.

A magneto-optical crystal plate employed in the present invention may be prepared by the liquid phase epitaxy (LPE) method on a substrate such as a neodymium-gallium-garnet crystal or a gadolinium-gallium-garnet crystal a part of which is substituted with carcium, zirconium or magnesium with a thickness of ca. 0.1–0.3 mm.

Figure 3:
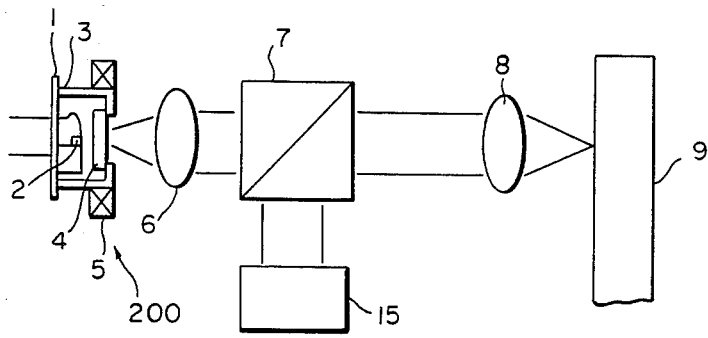
FIG. 3 is a block diagram showing a laser package of the first embodiment used as a pickup for a video disc.

FIG. 3 shows the LD device 200 of FIG. 1 employed in an optical pickup. The LD device 200 emits 0.78 micron light through a magneto-optical crystal plate 4. A collimating lens 6 is arranged to oppose the crystal plate to focus output light in parallel beams. The reference numeral 7 denotes a half mirror, and 8 an objective lens which focuses collimated beams emanating from the half mirror on the surface of an optical disc 9.

A semiconductor laser diode 2 emits linear polarized light having an electric field component parallel to the p-n junction plane of the laser diode. The light transmitting through the magneto-optical crystal plate 4 to which a magnetic field 5 is applied in the direction of light transmission is subjected to Faraday rotation. The thickness of the plate 4 is set at 45 microns so as to provide a linear polarized light with an angle at 45° to the incident polarization. One half of the light focussed in parallel by the lens 6 transmits straight through the half mirror 7, is converged by the lens 8, reflected by the disc surface 9 and re-enters to the half mirror again. One half of the light which re-enters the half mirror advances straight to the semiconductor laser through the lens 6. The other half is deflected by 90° in its path by the half mirror and led to an optical receiver system 15 which receives focus or tracking error signals, or disc recording signals. The light returning to the LD package is further subjected to Faraday rotation of 45° when it passes through the crystal plate 4 toward the semiconductor laser 2. In other words, the polarization direction of the light re-entering the semiconductor laser 2 is perpendicular to that of the light emanating from the said laser, having no adverse effect on the laser oscillation.

Although a pickup accompanied by the laser apparatus of the present invention adds an absorption loss of 2 dB to a conventional one, it provides an isolation of 49 dB, which is 34 dB greater than that of the conventional pickup.

FIG. 4 shows the first embodiment of the present invention employed as the light source of an optical communication device. As the LD shown in FIG. 1, a laser which oscillates at the wavelength of 1.3 microns is used in this embodiment. A magneto-optical crystal member is set at 150 microns to provide 45° of Faraday rotation to the light of the wavelength of 1.3 microns. The reference numeral 10 denotes a rod lens and 11 an optical fiber. The light emanating from the semiconductor laser 2 transmits through the magnetized magneto-optical crystal plate 4 and is coupled to the optical fiber through a coupling lens 10. The light reflected from the incidence and emanation ends of the lens and optical fiber transmits through the magnetic optical crystal plate again as polarized light perpendicular to the emanating light so that, as described above noise is not induced even if this light re-enters the semiconductor laser.

FIG. 5 shows an embodiment of the LD device 200 provided further with a polarized light isolator comprising a polarizing prism 13 and a quarter-wave length plate 14 in combination.

Since the isolation of a simple isolator combining a polarizing prism and a quarter-wave length plate is usually at least $-15$ dB and the isolation of a magnetooptical element is $-35$ dB, the total of at least $-50$ dB isolation, in other words, less than 0.001% return is obtained. Such a low amount of returning light will not cause noise.

FIG. 6 is a perspective view of the second embodiment of the present invention, partially exploded and cross sectioned. The difference from the first embodiment shown in FIG. 1 lies in that, instead of using the magneto-optical single crystal in the window 100 of the cap 3, a garnet film 4b is vapor-deposited on an optical glass 4a by a sputtering method. The thickness of the garnet film is such as to subject the polarized light passing through the film under the applied magnetic field of magnet 5 to 45° of Faraday rotation.

The garnet film employed in the embodiment may be prepared, for example, as in the following. Using an ordinary RF sputtering apparatus or planar magnetron sputtering apparatus, an amorphous film is formed on a substrate of optical glass, by sputtering a sintered compact which is prepared by sintering powder of bismuth oxide, yttrium oxide, or iron oxide under an argon or oxygen atmosphere. The film is crystalized in a thermal process in the atmosphere or in oxygen. Besides the above sputtering method, the film may be formed by other methods such as a MBE method (molecular-beam epitaxial method) and a PVD method which is widely known as the ionized beam sputtering method. Compared to the film prepared by the ordinary LPE method, the amount of bismuth substitution can be greatly increased in a garnet film $Bi_xY_{3-x}Fe_5O_{12}$ in which yttrium is substituted with bismuth. Faraday rotatability increases in proportion to the increase in the substituted amount of bismuth. For example, in a film prepared by an LPE method, substitution of bismuth is $x \simeq 1$ at most, whereas the amount can be increased to $x \simeq 3$ by a sputtering method, which increases Faraday rotatability almost 3 times as much. With the composition of $x \simeq 1$, the thickness of the material required to achieve 45° rotation of the polarized light of the wavelength of 0.8 micron is 45 microns whereas with $x \simeq 3$ material, only 15 microns of thickness can achieve the same result. This level of thickness can be easily realized by the present film forming technique. Furthermore, it is reported that the addition of cobalt to the film increases Faraday rotatability. If oxygen in the composition of $R_3Fe_5O_{12}$ (R is a rare-earth atom) is substituted with a sulfur atom, to obtain for example, the resultant composition of $R_3Fe_5S_{7.5}O_{4.5}$, Faraday rotatability is further increased. By selecting a suitable composition, film thickness required for 45° rotation of polarized light can be further reduced.

Figure 7:
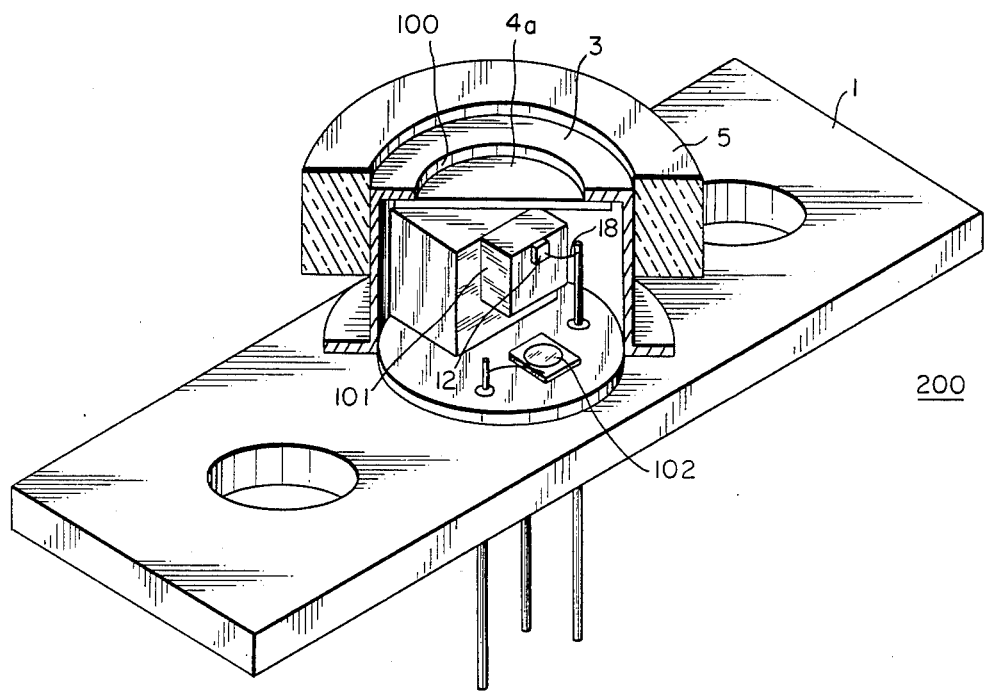
Figure 8:
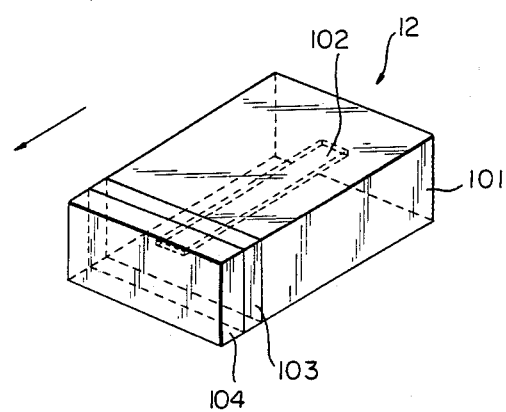
FIG. 8 is a perspective view of a laser diode employed in FIG. 7.

FIG. 7 shows the third embodiment of the present invention. This embodiment is different from the first embodiment in that an ordinary optical glass 4a instead of the magneto-optical crystal member 4 is used as the window 100 of the cap 3, and LD 12 is used instead of LD 2. Details of LD 12 are shown in FIG. 8. Reference numeral 101 in the figure denotes a semiconductor laser chip and 102 a laser active region contributing to laser oscillation of the semiconductor laser. One end face of the chip is cleavaged and the other end face is provided with a dielectric film 103 of non-magneto-optical substance. A garnet film 104 having a magneto-optical characteristic is formed on said dielectric film 103. The film 103 is an optical buffer layer which through addition of a garnet film thereon prevents reflectivity of the end face of the semiconductor laser from decreasing to a degree as low as to inhibit laser oscillation. The film is formed, for example, from silicon oxide ($SiO_2$) by a sputtering method to obtain a half wavelength. This LD 12 is placed in the cap in such a way as to oppose the garnet film surface 104 to the optical glass plate 4a (FIG. 7). In this LD device 200, polarization of the light oscillating under the magnetic field provided by the magnet 5 is subjected to 45° of Faraday rotation by transmitting through the garnet film 4. The light reflected from the reflective surfaces existing and returning to the semiconductor laser chip 101 is rotated by 45° further when it transmits through said garnet film 104 again in the opposite direction. Since the polarization direction of the light reflected is perpendicular to that of the oscillating light, noise which otherwise might be caused by the returning light is not induced even if it re-enters the semiconductor laser.

What is claimed is:

1. A semiconductor laser apparatus with an optical isolation function comprising:
   a semiconductor laser diode;
   means for mounting said semiconductor laser diode;
   a casing with a window through which oscillation light from said semiconductor laser diode passes, for hermetically sealing said semiconductor laser diode;
   a magneto-optical member, provided between an end face of said semiconductor laser diode and said window, and having spontaneous magnetization oriented in the direction of said oscillation light transmission, for polarizing oscillation light that is reflected back to said laser diode through said window at 90° with respect to said oscillation light that passes through said window from said laser diode; and
   means for applying a magnetic field in the direction of said oscillation light transmission in a manner to saturate the spontaneous magnetization of said magneto-optical member.

2. An apparatus as set forth in claim 1, wherein said magneto-optical member comprises a crystal.

3. An apparatus as set forth in claim 2, wherein said crystal has a composition of $Gb_{3-x}Bi_xFe_5O_{12}$.

4. An apparatus as set forth in claim 1, wherein said magneto-optical member is set to provide 45° of Faraday rotation to light emitted from said laser diode.

5. An apparatus as set forth in claim 1, wherein said magneto-optical element comprises a garnet film on said window.

6. An apparatus as set forth in claim 5, wherein said garnet film has a composition of $Bi_xY_{3-x}Fe_5O_{12}$.

7. An apparatus as set forth in claim 5, wherein said garnet film has a composition of $R_3Fe_5S_{7.5}O_{4.5}$ where R is a rare earth atom.

8. An apparatus as set forth in claim 1, wherein said magneto-optical member comprises a garnet film connected to said semiconnector laser diode.

9. An apparatus as set forth in claim 8, including a dielectric film provided over one end face of said semiconnector laser diode, said garnet film being provided directly over said dielectric film.

* * * * *